United States Patent
Suzuki et al.

(10) Patent No.: US 7,863,695 B2
(45) Date of Patent: Jan. 4, 2011

(54) COMPLEMENTARY MISFET SEMICONDUCTOR DEVICE HAVING AN ATOMIC DENSITY RATIO ALUMINUM/LANTHANUM (AL/LA) IN THE GATE INSULATING LAYER OF PMIS IS LARGER THAN THAT OF THE NMIS

(75) Inventors: Masamichi Suzuki, Yokohama (JP);
Masato Koyama, Miura-gun (JP);
Yoshinori Tsuchiya, Yokohama (JP);
Hirotaka Nishino, Yokohama (JP);
Reika Ichihara, Yokohama (JP); Akira Takashima, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 12/200,599

(22) Filed: Aug. 28, 2008

(65) Prior Publication Data

US 2009/0114995 A1 May 7, 2009

(30) Foreign Application Priority Data

Nov. 5, 2007 (JP) ............................. 2007-287870

(51) Int. Cl.
*H01L 27/092* (2006.01)
*H01L 21/8238* (2006.01)
(52) U.S. Cl. ................. 257/411; 257/369; 257/E27.062
(58) Field of Classification Search ................. 257/369, 257/411
See application file for complete search history.

(56) References Cited

U.S. PATENT DOCUMENTS 4,870,079 A * 9/1989 Britcher et al. ............. 514/289
7,078,301 B2 * 7/2006 Bojarczuk et al. ........... 438/287
7,391,085 B2 6/2008 Ichihara et al.

(Continued)

FOREIGN PATENT DOCUMENTS

JP 2004-214386 7/2004

(Continued)

OTHER PUBLICATIONS

Lu et al.; "Field-Effect Transistors With $LaAlO_3$ and $LaAlO_xN_y$ Gate Dielectrics Deposited by Laser Molecular-Beam Epitaxy", Applied Physics Letters, vol. 85, No. 16, pp. 3543-3545, (2004).

(Continued)

*Primary Examiner*—Anh D Mai
(74) *Attorney, Agent, or Firm*—Finnegan, Henderson, Farabow, Garrett & Dunner, L.L.P.

(57) ABSTRACT

A complementary semiconductor device includes a semiconductor substrate, a first semiconductor region formed on a surface of the semiconductor substrate, a second semiconductor region formed on the surface of the semiconductor substrate apart from the first semiconductor region, an n-MIS transistor having a first gate insulating film including La and Al, formed on the first semiconductor region, and a first gate electrode formed on the gate insulating film, and a p-MIS transistor having a second gate insulating film including La and Al, formed on the second semiconductor region, and a second gate electrode formed on the gate insulating film, an atomic density ratio Al/La in the second gate insulating film being larger than an atomic density ratio Al/La in the first gate insulating film.

8 Claims, 13 Drawing Sheets

U.S. PATENT DOCUMENTS

| | | |
|---|---|---|
| 7,410,855 B2 | 8/2008 | Ichihara et al. |
| 7,736,446 B2 * | 6/2010 | Takashima et al. .......... 148/284 |
| 2006/0054961 A1 | 3/2006 | Suzuki et al. |
| 2006/0086993 A1 | 4/2006 | Suzuki et al. |

FOREIGN PATENT DOCUMENTS

| | | |
|---|---|---|
| JP | 2006-080409 | 3/2006 |
| JP | 2006-222385 | 8/2006 |

OTHER PUBLICATIONS

Kim et al.; "Effects Of Al Content On The Electrical Properties of $La_xAl_yO_z$ Films Grown On TiN Substrate By Atomic Layer Deposition", Applied Physics Letters, vol. 90, 103104, pp. 103104-1-103104-3, (2007).

* cited by examiner

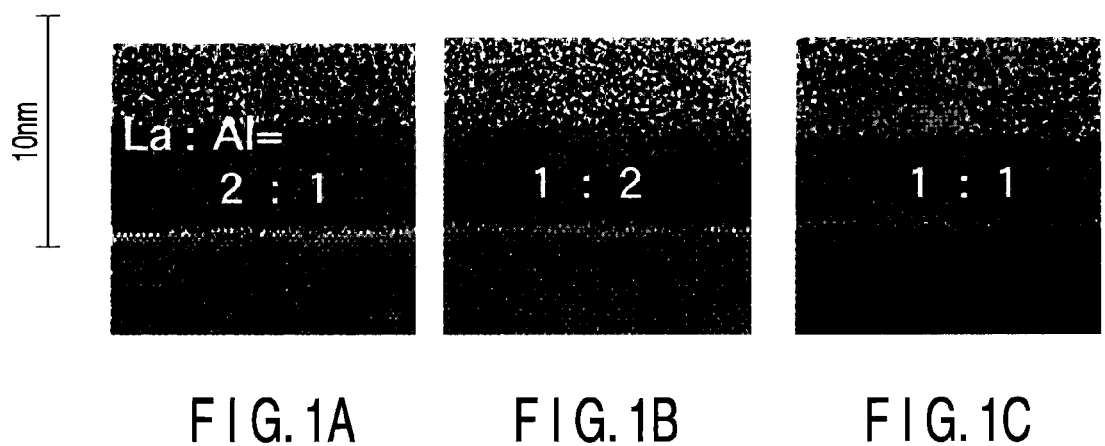
F I G. 1A  F I G. 1B  F I G. 1C

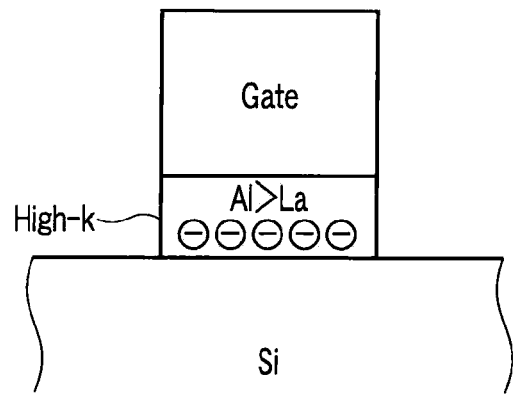
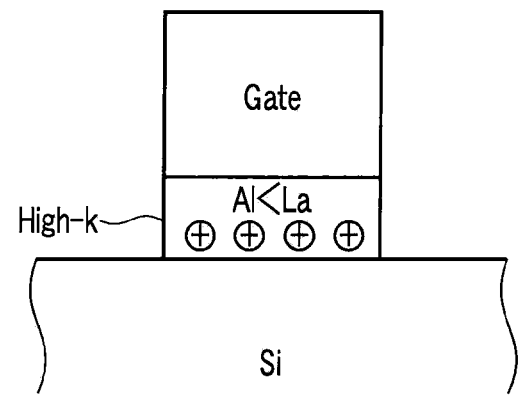
F I G. 5A  F I G. 5B
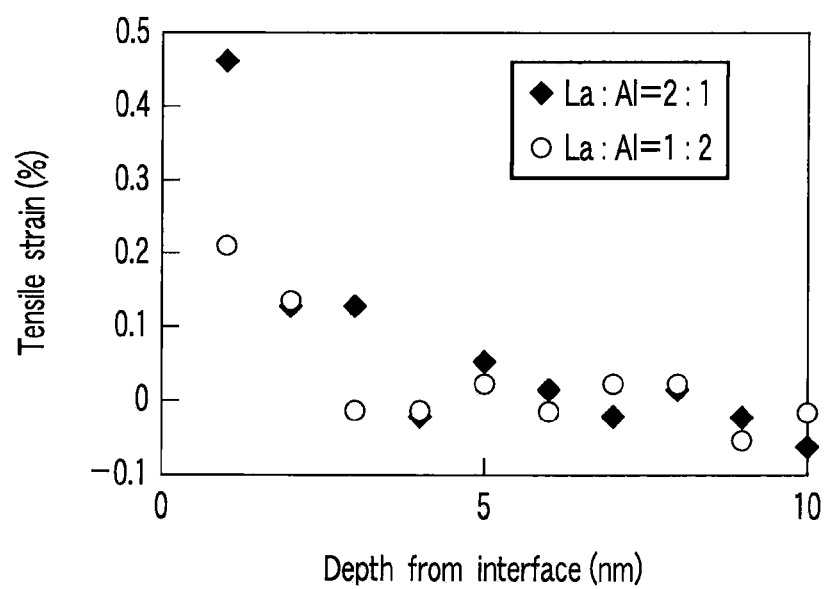
F I G. 6

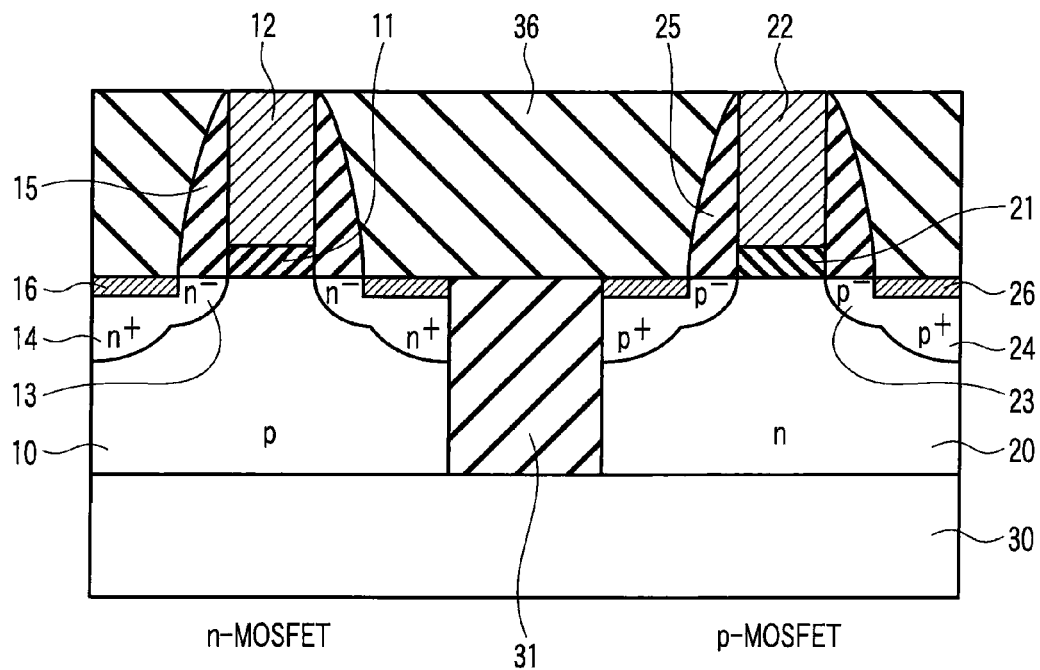
F I G. 7
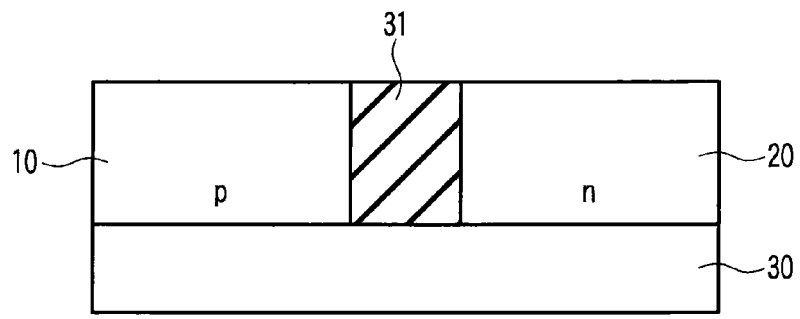
F I G. 8A
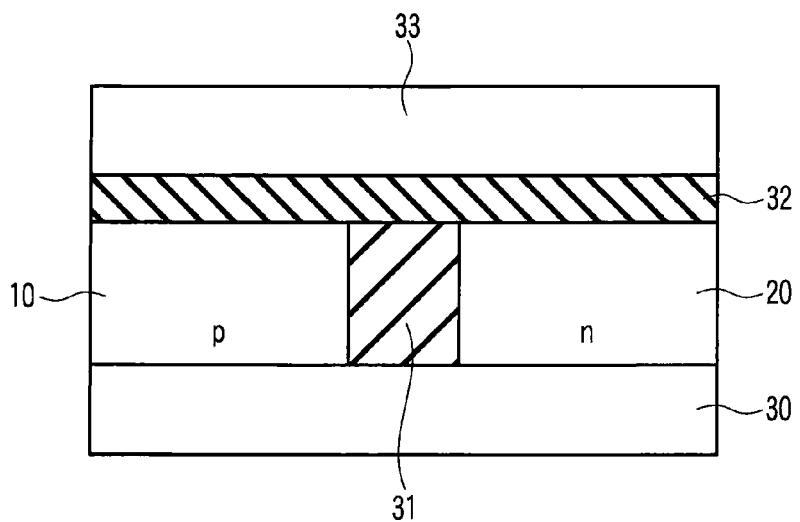
F I G. 8B

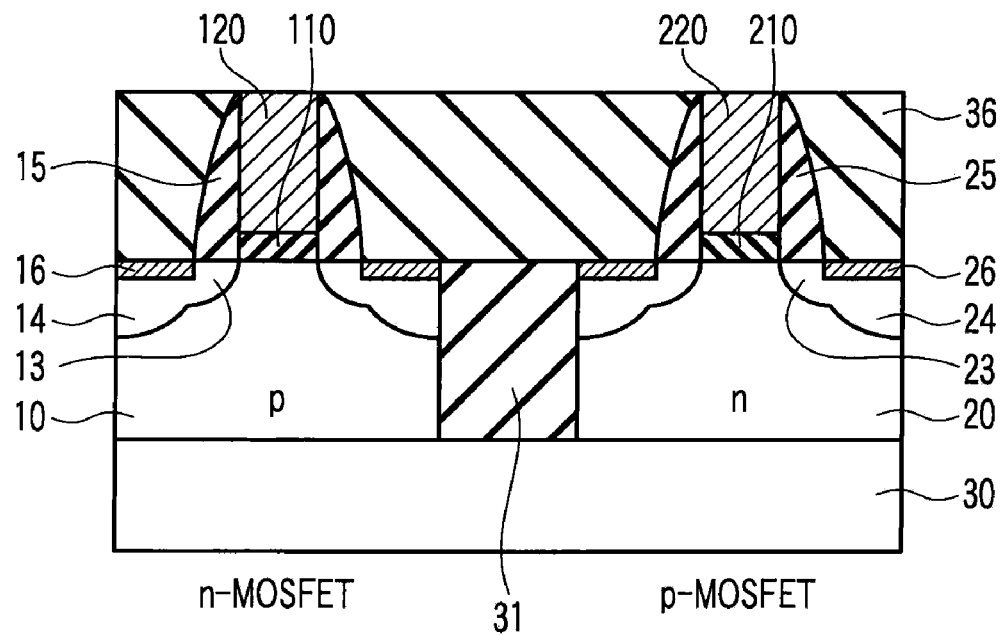
F I G. 11C
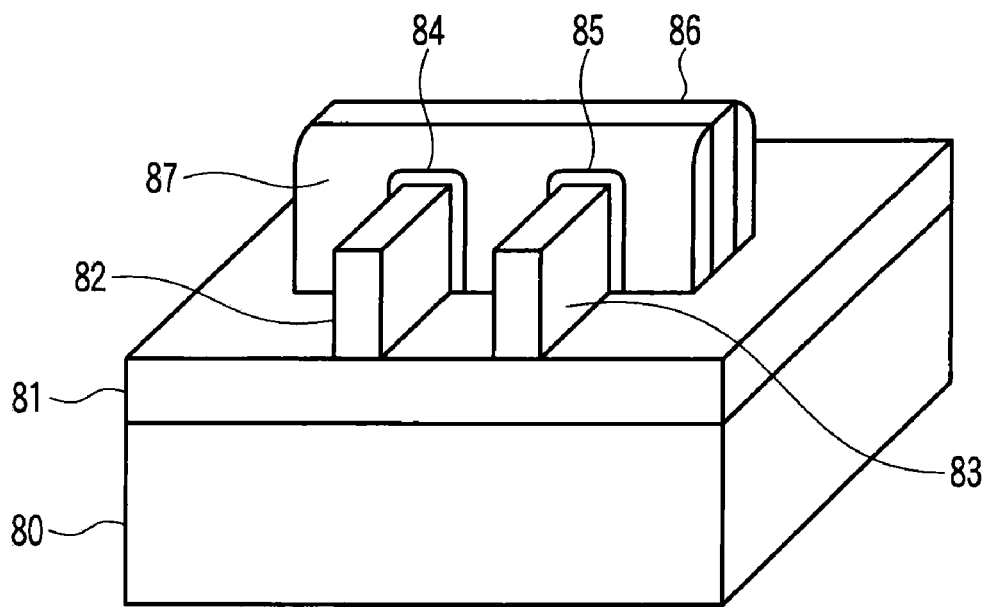
F I G. 12

COMPLEMENTARY MISFET SEMICONDUCTOR DEVICE HAVING AN ATOMIC DENSITY RATIO ALUMINUM/LANTHANUM (AL/LA) IN THE GATE INSULATING LAYER OF PMIS IS LARGER THAN THAT OF THE NMIS

CROSS-REFERENCE TO RELATED APPLICATIONS

This application is based upon and claims the benefit of priority from prior Japanese Patent Application No. 2007-287870, filed Nov. 5, 2007, the entire contents of which are incorporated herein by reference.

BACKGROUND OF THE INVENTION

1. Field of the Invention

The present invention relates to a complementary semiconductor device using a metal gate electrode and a high-dielectric-constant (high-k) gate insulating film, and to a method of manufacturing the same.

2. Description of the Related Art

Slimming of a gate insulating film is required for device scale reduction to realize high performance of an LSI. In order to meet the foregoing requirements, the following studies have been made. Specifically, a so-called high-k insulating film having a dielectric constant higher than $SiO_2$ is used as the gate insulating film. A metal gate electrode eliminating a depletion layer peculiar to a polysilicon electrode is used as a gate electrode. The foregoing new materials are able to slim an effective gate insulating. In this way, it is expected to realize a low power consumption device having a leakage current lower than $SiO_2$.

The following condition is a premise of selecting a metal gate electrode material. Namely, in order to reduce power consumption, the metal gate electrode shows a work function for applying a proper threshold voltage at an interface with a gate insulating film in both n- and p-MOS transistors. Specifically, in the n-MOS transistor, the metal gate electrode preferably has a work function of about 4.1 eV close to energy of a silicon conduction band. In the p-MOS transistor, the metal gate electrode preferably has a work function of about 5.2 eV close to energy of a silicon valence band.

However, when different metal materials are used as the gate electrode each of n- and p-MOS transistors, the manufacturing process is extremely troublesome, and thus, this is a factor of causing an increase of the manufacturing cost. Under the present circumstances, there is not still found a metal material for each of the metal gate electrodes for n- and p-MOS transistors, that is, the metal material which has a tolerance to LSI manufacture process such as heat treatment for activating a source/drain region and shows the foregoing work functions. More specifically, there is the following tendency (e.g., see JP-A 2006-222385 (KOKAI)). According to the tendency, a gate electrode material used for the n-MOS transistor has a work function more than an ideal value; conversely, a gate electrode material used for the p-MOS transistor has a work function lower than the ideal value. As a result, the threshold voltage of each transistor becomes high.

In view of the foregoing circumstances, it is desired to realize a complementary semiconductor device, which can obtain a proper threshold voltage in both n- and p-MIS transistors using a metal gate electrode and a high-dielectric-constant gate insulating film, and a method of manufacturing the same.

BRIEF SUMMARY OF THE INVENTION

According to a first aspect of the invention, there is provided a complementary semiconductor device, which includes:

a substrate;

a first semiconductor region formed on a surface of the substrate;

a second semiconductor region formed on the surface of the substrate apart from the first semiconductor region;

an n-MIS transistor having a first gate insulating film including La and Al, formed on the first semiconductor region, and a first gate electrode formed on the first gate insulating film; and a p-MIS transistor having a second gate insulating film including La and Al, formed on the second semiconductor region, and a second gate electrode formed on the second gate insulating film, an atomic density ratio Al/La in the second gate insulating film being larger than an atomic density ratio Al/La in the first gate insulating film.

According to a second aspect of the invention, there is provided a method of manufacturing a complementary semiconductor device, which includes:

forming a first semiconductor region and a second semiconductor region on a surface of a substrate;

forming a first gate insulating film including La and Al on the first semiconductor region;

forming a second gate insulating film, which includes La and Al and has an atomic density ratio Al/La larger than an atomic density ratio Al/La in the first gate insulating film;

forming a first gate electrode of an n-MIS transistor on the first gate insulating film;

forming a second gate electrode of a p-MIS transistor on the second gate insulating film.

According to a third aspect of the invention, there is provided a method of manufacturing a complementary semiconductor device, which includes:

forming a first semiconductor region and the second semiconductor region on a surface of a substrate;

forming a first gate insulating film on the first semiconductor region and a second gate insulating film on the second semiconductor region, both the first gate insulating film and the second gate insulating film including La and Al, and formed of the same material;

forming a first gate electrode of an n-MIS transistor on the first gate insulating film;

forming a second gate electrode of a p-MIS transistor on the second gate insulating film; and setting an atomic density ratio Al/La in the second gate insulating film larger than an atomic density ratio Al/La in the first gate insulating film, by implanting Al ions into the second gate insulating film via the second gate electrode or implanting La ions into the first gate insulating film via the first gate electrode.

BRIEF DESCRIPTION OF THE SEVERAL VIEWS OF THE DRAWING

FIGS. 1A to 1C are cross-sectional TEM images of films deposited by PLD method using sintered compact targets, where ratios of constituent elements La and Al are 2:1 (FIG. 1A), 1:2 (FIG. 1B) and 1:1 (FIG. 1C);

FIGS. 5A and 5B are vies showing a state of fixed charges formed at a substrate interface with a gate insulating film containing La and Al, and shows that FIG. 5A is the case of Al>La, and FIG. 5B is the case of Al<La;

FIG. 6 is a graph showing a depth direction distribution indicating that when La concentration is high, a tensile strain of a substrate increases;

FIG. 7 is a cross-sectional view schematically showing the structure of a CMOS transistor according to a first embodiment;

FIGS. 8A to 8M are cross-sectional views stepwise showing a process of manufacturing the CMOS transistor according to the first embodiment;

FIGS. 11A to 11C are cross-sectional views stepwise showing a process of manufacturing a CMOS transistor according to a fourth embodiment; and FIG. 12 is a perspective view schematically showing the structure of a CMOS transistor according to a fifth embodiment.

DETAILED DESCRIPTION OF THE INVENTION

The outline of the present invention will be described before explanation of various embodiments. According to the present invention, an atomic density ratio Al/La of Al to La of a gate insulating film of a p-MIS transistor is set larger than that of a gate insulating film of an n-MIS transistor. The foregoing settings provides proper threshold voltage applicable to both n- and p-MIS transistors.

A gate insulating film including LaAlO is given as motif, and each concentration of La and Al contained in the gate insulating film is controlled to control the threshold voltage. The experimental results will be hereinafter described.

FIGS. 1A to 1C are sectional images of a deposited film taken by a transmission electron microscope (TEM). In this case, the film is deposited by a pulsed laser deposition (PLD) method using a sintered compact target prepared by mixing La$_2$O$_3$ and Al$_2$O$_3$ at the following ratios 2:1, 1:2 and 1:1. The used substrate is a p-type Si substrate removing a native oxide film by diluted hydrofluoric acid treatment. The deposition condition is common in all films, and the substrate temperature is 600° C., and further, deposition atmosphere is a vacuum atmosphere.

A large difference is not observed in three sectional structures shown in FIGS. 1A to 1C, and these films are all in an amorphous state. In addition, a low-dielectric-constant (low-k) interface layer such as SiO$_2$ is not observed. This is the same result as the case where deposition is carried out using a LaALO$_3$ single crystal as a target (e.g., see JP-A 2006-80409 (KOKAI)).

Figure 2A:
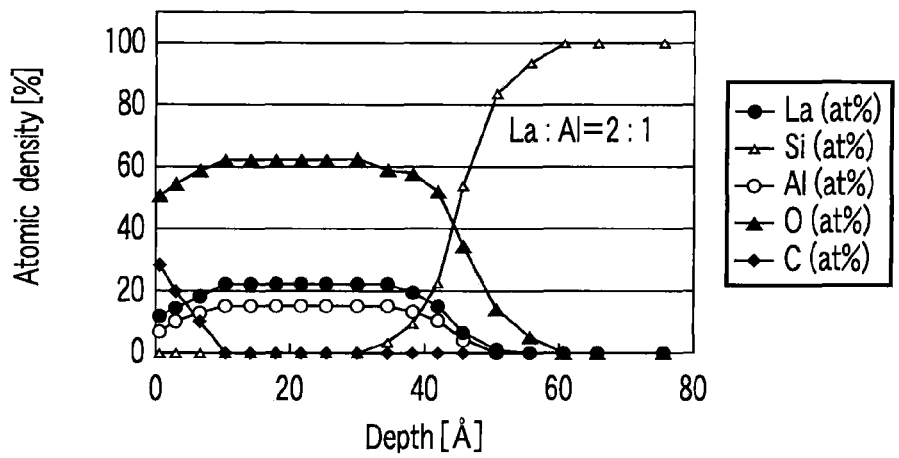
FIGS. 2A to 2C are graphs showing element depth direction distributions obtained by RBS analysis with respect to samples shown in FIGS. 1A to 1C.
Figure 2B:
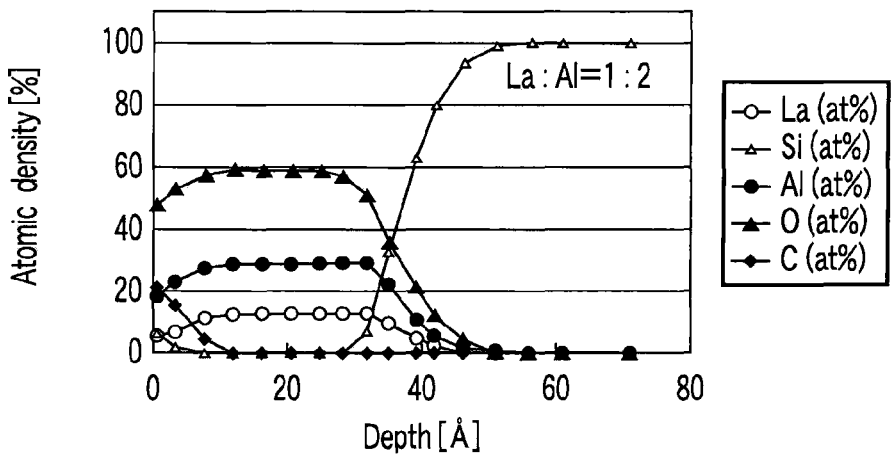
Figure 2C:
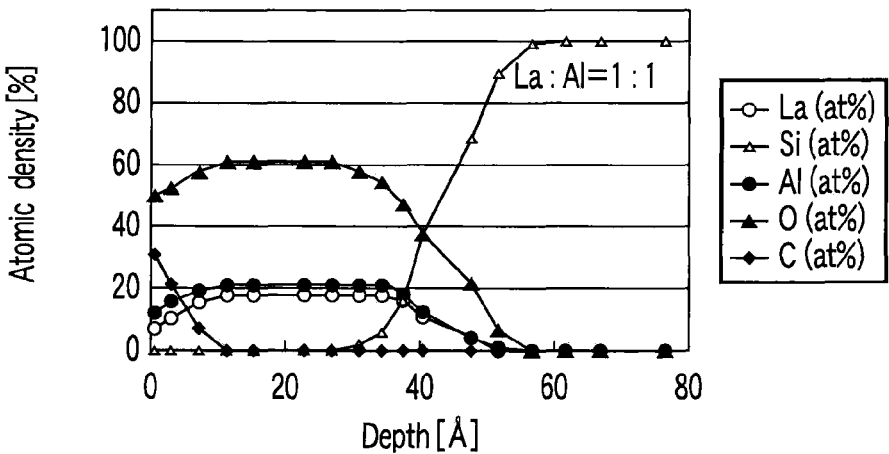

FIGS. 2A to 2C are graphs showing a depth direction profile of each element obtained by making a Rutherford backscattering spectroscopy (RBS) analysis with respect to samples shown in FIGS. 1A to 1C. As seen from these FIGS. 2A to 2C, there naturally exists the difference in concentration of La and Al contained in the film between samples depending on the composition of the target. However, other typical differences are not observed.

Figure 3:
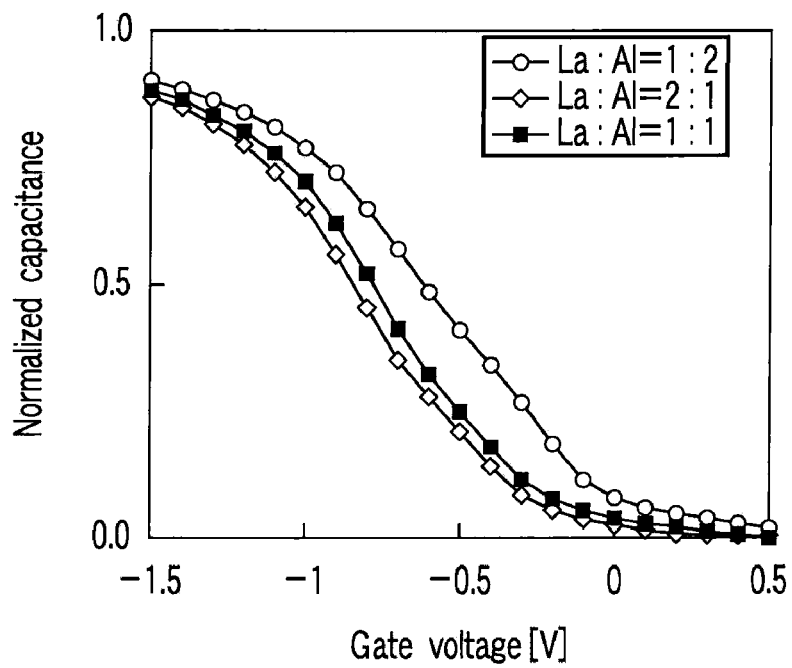
FIG. 3 is a capacitance-voltage characteristic chart showing that a flat band voltage shifts depending on the composition of a LaAlO$_3$ gate insulating film deposited on a p-type Si substrate using a PLD method.

FIG. 3 is a capacitance-voltage characteristic chart of capacitors, which are prepared by using these films as a gate insulating film and depositing Mo as an electrode. In FIG. 3, there is shown a La:Al composition ratio of the target used for deposition. In addition, the composition ratio of the deposited film is the same as that of the target.

As depicted in FIG. 3, it can be seen that a flat band voltage changes depending on the composition of the gate insulating film. More specifically, the curved line of the sample of La:Al=1:1 is shown at an intermediate portion. When Al becomes rich, the flat band voltage shifts to a positive side; conversely, when La becomes rich, it shifts to a negative side. As a result, if the gate insulating film is formed of La, Al and O, Al acts on the shift of the flat band voltage to the positive side, and La acts on the shift of the flat band voltage to the negative side. From the result of FIG. 3, it can be seen that when the absolute value of the shift is compared, the shift by Al is larger than that of La.

Figure 4:
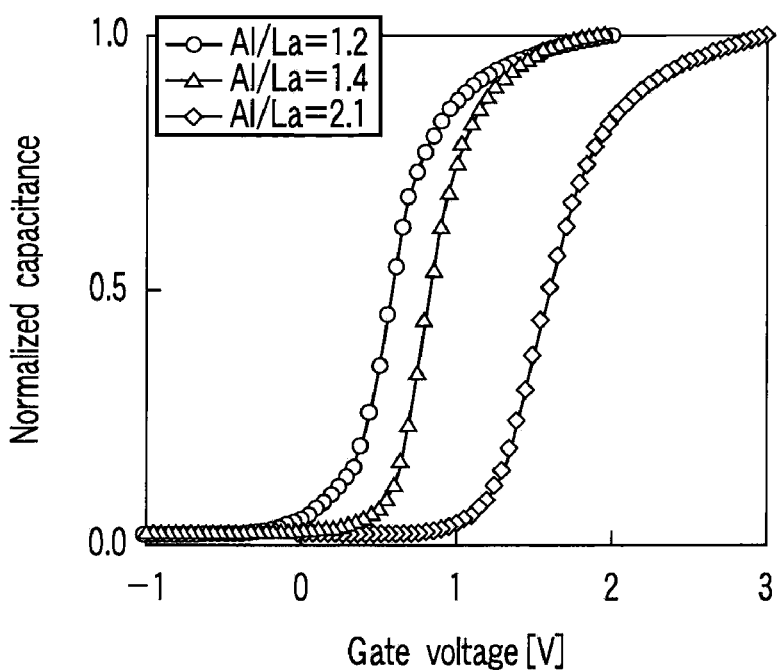
FIG. 4 is a capacitance-voltage characteristic chart showing that a flat band voltage shifts depending on the composition of a LaAlO$_3$ gate insulating film deposited on a p-type Si substrate using a MBE process.

FIG. 4 is a capacitance-voltage characteristic chart of a capacitor prepared in the following manner. Specifically, a LaAlO film is deposited on an n-type Si substrate while La and Al is vaporized in an oxygen atmosphere via a molecular beam epitaxy (MBE) process and the concentration ratio of La and Al is changed like the PLD process. Mo is further used as an electrode. In any cases, an oxygen partial pressure is the same. In FIG. 4, there is shown an Al/La concentration ratio obtained by making a quantitative analysis using an inductively coupled plasma-mass spectrometry (ICP-MS).

As shown in FIG. 4, even if the capacitor is prepared under the forgoing condition, it can be seen that when Al becomes rich, the flat band voltage shifts to a positive side. From the result of FIGS. 3 and 4, it can be seen that the shift of the flat band voltage resulting from La and Al is a material inherent phenomenon occurring without depending on deposition process and substrate polarity. As a matter of course, the foregoing shift of the flat band voltage corresponds to a shift of the threshold voltage of MIS transistors. Thus, considering the foregoing action by La and Al, a concentration ratio of La and Al contained in the gate insulating film is changed, and thereby, the threshold voltage of a CMOS transistor is controllable. More specifically, the following settings are effective in order to realize a CMOS transistor applying a proper threshold voltage. Namely, it is effective that an Al/La concentration ratio of the gate insulating film in a p-type MOS transistor is set larger than that of the gate insulating film in an n-type MOS transistor.

As described above, there exists a phenomenon that the shift direction of the threshold voltage is reverse by La and Al. This results from the matter such that a polarity of fixed charges given in the gate insulating film by La and Al is reverse. Specifically, when Al is rich, minus fixed charges are generated at a substrate interface as illustrated in FIG. 5A, and thereby, the flat band voltage is shifted to a positive side. Conversely, when La is rich, plus fixed charges are generated at a substrate interface as illustrated in FIG. 5B, and thereby, the flat band voltage is shifted to a negative side. From the foregoing fact, it is expected that the following phenomenon occurs. Namely, FIGS. 3 and 4 show the result given by the structure in which an Si substrate and LaAlO$_3$ are directly jointed together. However, in this case, even if a layer including an Si oxide is formed between a LaAlO$_3$ film and the Si substrate, the foregoing shift is supposed to be generated.

FIG. 6 is a graph showing a tensile strain analysis result in the depth direction of an Si substrate interface analyzed by a RBS channeling technique. As seen from FIG. 6, when La concentration is high, the tensile strain increases. An increase of tensile strain in an n-type MOS transistor is effective in improvement of carrier mobility; therefore, this is preferable. Therefore, the foregoing the gate insulating film having high La concentration is used for the n-type MOS transistor. This is preferable in the light of carrier mobility in addition to threshold voltage control. Moreover, it was confirmed that strain applied resulting from the gate insulating film is fully lost at the depth of 10 nm apart from the interface.

The following method has been disclosed in JP-A 2004-214386 (KOKAI). According to the method, a crystalline metal oxide insulating film having lattice spacing different from a substrate is formed on a channel as a gate insulating film via epitaxial growth. In this way, the lattice spacing of a channel region is modulated to improve carrier mobility. According to this phenomenon, the gate insulating film is an epitaxial film; for this reason, an Si substrate contains a strain of about 0.7% approximately uniformly to a depth of 50 nm from the interface. If the foregoing strain exists over the depth of 50 nm or more, there are the following problems. Specifically, there is a possibility that device characteristic is deteriorated because the substrate is weak in mechanical impact, and dislocation, that is, crystal defect is generated to relax strain. In addition, uniformity between devices is not obtained. On the contrary, if the gate insulating film is formed using an amorphous high-dielectric-constant (high-k) insulating film containing La and Al, the strain thus generated has no problem described above. In addition, the amorphous insulating film is formed via a very simple process as compared with epitaxial growth.

A CMOS semiconductor device having the following structure has been disclosed in the foregoing JP-A 2006-222385 (KOKAI)(hereinafter, referred to as 385 Publication). According to the structure, at least metal electrode side of a gate insulating film of a p-MOS transistor is formed of an oxide containing any of rare earth elements such as Zr, Hf, Ti, Ta, Nb, V and La. Moreover, at least metal electrode side of a gate insulating film of an n-MOS transistor is formed of an insulator containing any of Al, Si and Ge. In addition, the foregoing 385 Publication has the following description to control the threshold voltage. Specifically, considering the difference of electro-negativity of atoms contacting with the metal electrode interface, the following condition is required. Namely, Al concentration is high in the n-MOS transistor while La concentration is high in the p-MOS transistor.

According to the foregoing 385 Publication, the concentration ratio of La and Al with respect to the n- and p-MOS transistors is reverse to the present embodiment. Thus, the structure of the gate insulating film of a CMOS transistor is clearly different from the 385 Publication. This is because the phenomenon to control the threshold voltage is different between the 385 Publication and the present embodiment. In other word, according to the 385 Publication, the difference of electro-negativity of elements arranged at the interface with an electrode is used. On the contrary, according to the present invention, fixed charges given by elements (La, Al) forming an insulating film are used. Specifically, if the whole of the gate insulating film is formed of a high-dielectric-constant insulating film containing La and Al, the following matter was evident from the foregoing experimental result. Namely, the effect by fixed charges in the gate insulating film according to the present embodiment is higher than the effect of electro-negativity of elements arranged at the interface with the electrode according to the 385 Publication.

Hereinafter, various embodiments of the present invention will be described. The following description is the best mode of the invention, and changes and modifications are made within the scope of the invention to readily make other embodiment. The following description is not limited to the scope of the invention.

First Embodiment

FIG. 7 is a cross-sectional view schematically showing the structure of a complementary semiconductor device (CMOS transistor) according to a first embodiment of the present invention. An Si substrate 30 is formed with p-type and n-type Si regions 10 and 20 via a device isolation insulating film 31. A substrate having a silicon-on-insulator (SOI) structure may be used as the foregoing substrate. An n-MOS transistor is formed on the p-type Si region (first semiconductor region) 10 while a p-MOS transistor is formed on the n-type Si region (second semiconductor region) 20.

In the n-MOS transistor, an amorphous $LaAlO_3$ film having a concentration ratio of Al/La=1 is deposited as a gate insulating film (first gate insulating film) 11 on the p-type Si region 10 without having a $SiO_2$ interface layer. A gate electrode (first gate electrode) 12 including TaC is formed on the gate insulating film 11. The side portion of the gate insulating film 11 and the gate electrode 12 is formed with a gate sidewall insulating film 15 including SiN. The p-type Si region 10 is formed with a shallow extension layer ($n^-$ layer) 13 and a source/drain region ($n^+$ layer) 14. A NiSi layer 16 is formed on the source/drain region 14.

In the p-MOS transistor, an amorphous $LaAlO_3$ film having a concentration ratio of Al/La=1.5 is deposited as a gate insulating film (second gate insulating film) 21 on the n-type Si region 20 without having a $SiO_2$ interface layer. A gate electrode (second gate electrode) 22 including TaC is formed on the gate insulating film 21. The side portion of the gate insulating film 21 and the gate electrode 22 is formed with a gate sidewall insulating film 25 including SiN. The n-type Si region 20 is formed with a shallow extension layer ($p^-$ layer) 23 and a source/drain region ($p^+$ layer) 24. A NiSi layer 26 is formed on the source/drain region 24.

In this case, tensile strain is applied in accordance with the difference in the Al/La concentration ratio between the gate insulating films 11 and 21. Specifically, a larger tensile strain is applied to the p-type Si region 10, which functions as a channel region of the n-MOS transistor, as compared with the n-type Si region 20, which functions as a channel region of the p-MOS transistor.

An interlayer insulating film 36 including $SiO_2$ is formed on the substrate formed with the foregoing components by the same height as the upper surface of the gate electrodes 12 and 22.

The gate electrodes 12, 22 and gate sidewall insulating films 15, 25 are not limited to the above-mentioned structure. The material may be freely selected in accordance with the device usage.

Depth direction distribution of La and Al is not limited in the gate insulating film, and freely settable. However, if the shift of threshold voltage is made by fixed charges, the following condition is more effective. Namely, these fixed charges exist at a position apart from an electrode. Thus, preferably, Al concentration is set higher in the substrate interface rather than the electrode interface in the p-MOS transistor. Likewise, preferably, La concentration is set higher in the substrate interface rather than the electrode interface in the n-MOS transistor.

The gate insulating films 11 and 21 are not limited to the base material so long as the gate insulating films of both n- and p-MOS transistors contain La and Al. For example, the following structure may be employed; specifically, La and Al are contained in HfSiO, HfO$_2$ and HfSiON. In addition, La and Al is arranged on the interface with a silicon substrate, and insulating films such as HfO$_2$ and HfSiO, HFSiON, HfAlO and HfLaO may be arranged on the interface with a gate electrode. When the foregoing insulating films such as HfO$_2$ and HfSiO, HFSiON, HfAlO and HfLaO are arranged on the interface with a gate electrode, it is possible to obtain the effect of the foregoing 385 Publication using the difference of electro-negativity.

According to the foregoing structure of this embodiment, an effective work function of the n-MOS transistor shows inherent value of TaC, that is, 4.1 eV. On the contrary, an effective work function of the p-MOS transistor shows 5.2 eV because the Al/La concentration ratio of the gate insulating film is higher than that of the n-MOS transistor. Thus, TaC is used as a gate electrode in common to n- and p-MOS transistors. In this way, both n- and p-MOS transistors are operable according to proper threshold voltage.

The following is an explanation about a method of manufacturing the CMOS transistor of the first embodiment.

As shown in FIG. 8A, an Si substrate (semiconductor substrate) 30 is formed with a p-type Si region (first semiconductor region) 10 and an n-type Si substrate region (second semiconductor region) via ion implantation process. A device isolation layer 31 including a silicon oxide layer is formed at the boundary surface between p-type and n-type Si regions 10 and 20.

As illustrated in FIG. 8B, a SiO$_2$ film 32 functioning as a dummy gate insulating film is deposited on p-type, n-type Si regions 10, 20 and device isolation layer 31. A polysilicon film 33 is further deposited as a dummy gate electrode on the SiO$_2$ film 32.

Figure 8C:
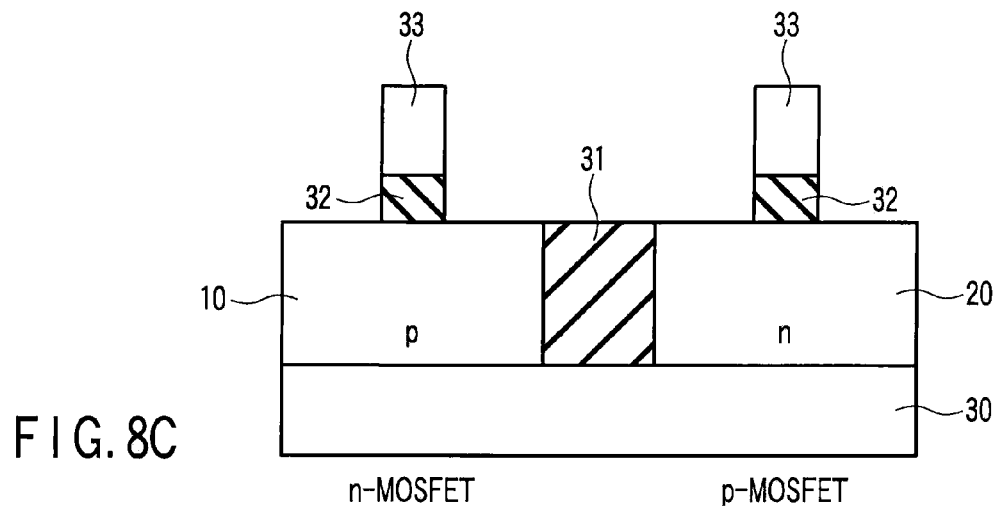

As depicted in FIG. 8C, the foregoing SiO$_2$ film 32 and polysilicon film 33 are etched using a known etching method such as RIE to form a dummy gate electrode structure.

Figure 8D:
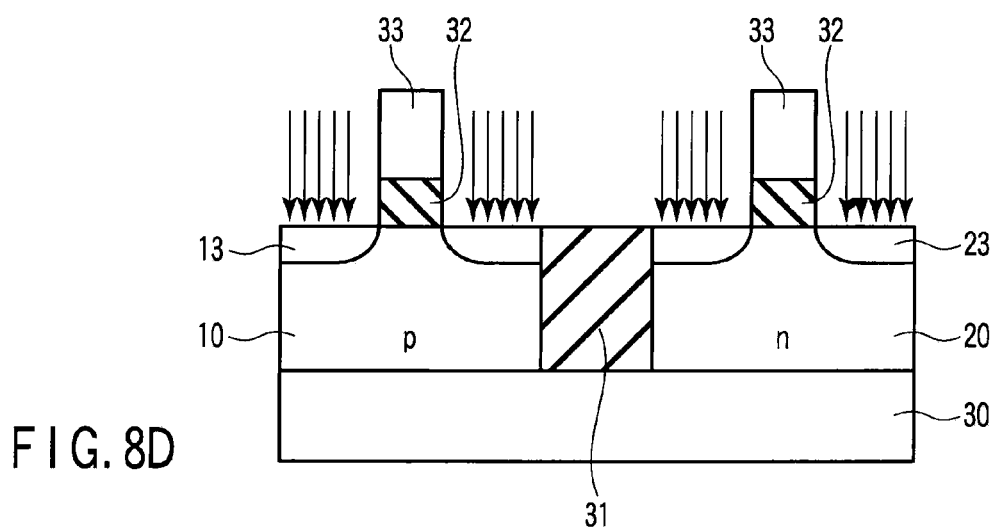

As seen from FIG. 8D, n-type and p-type impurity ions are implanted onto each of n- and p-MOS transistors using the dummy gate electrode structure as a mask via a known process. In this way, a diffusion layer functioning as extension layers 13 and 23 of a source/drain region is formed. In this case, when ion is implanted onto one FET, opposite-side FET is masked using a resist.

Figure 8E:
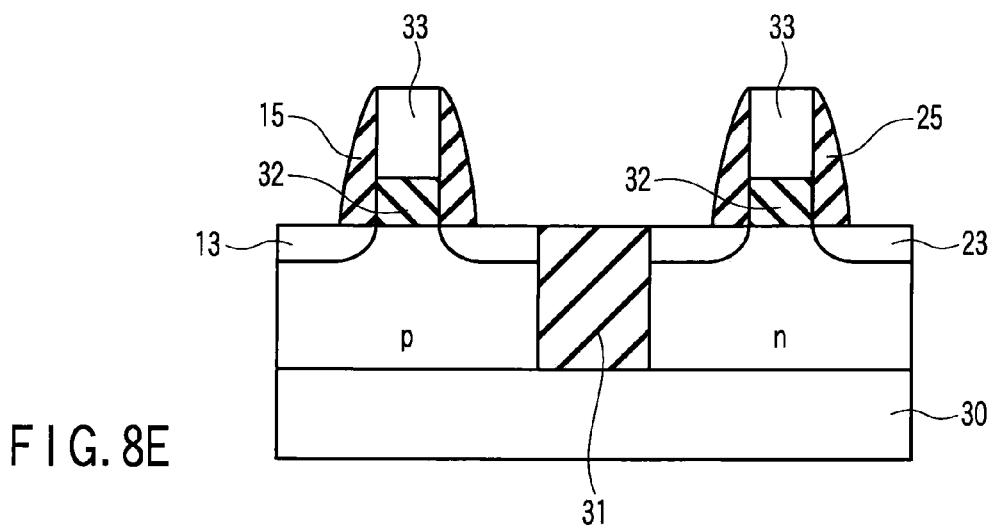

As shown in FIG. 8E, an SiN layer is deposited on the entire surface using a known process. Thereafter, etch-back is carried out using RIE to form gate sidewall insulating films 15 and 25.

Figure 8F:
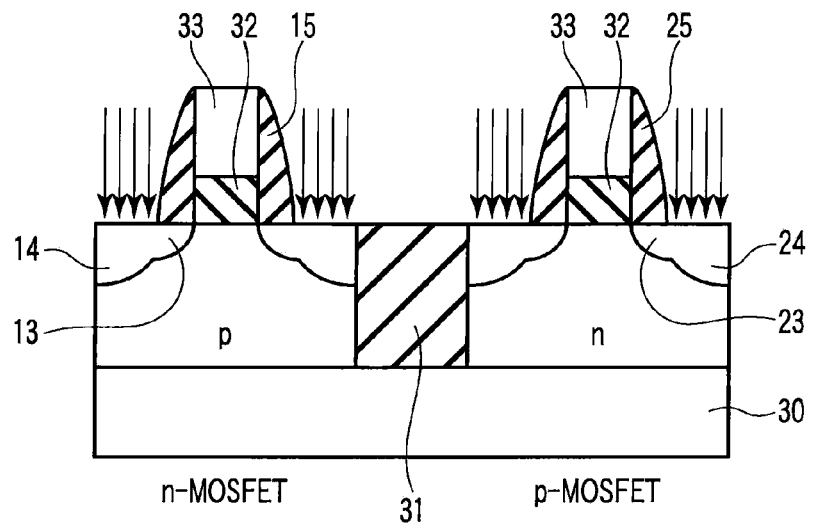

As illustrated in FIG. 8F, n-type and p-type impurity ions are implanted onto each of n- and p-MOS transistors using the dummy gate electrode structure and gate sidewall insulating films 15 and 25. Then, heat treatment for activation is carried out to form source/drain regions 14 and 24 including shallow extension layers 13 and 23. In this case, when ion is implanted onto one FET, opposite-side FET is masked using a resist.

The foregoing extension layers 13 and 23 may be formed using a selectively epitaxial growth process, and in view of device characteristic an elevated source and drain structure may be used, which is capable of preventing a short channel effect. When the elevated source and drain structure is formed, impurity may be simultaneously implanted.

Figure 8G:
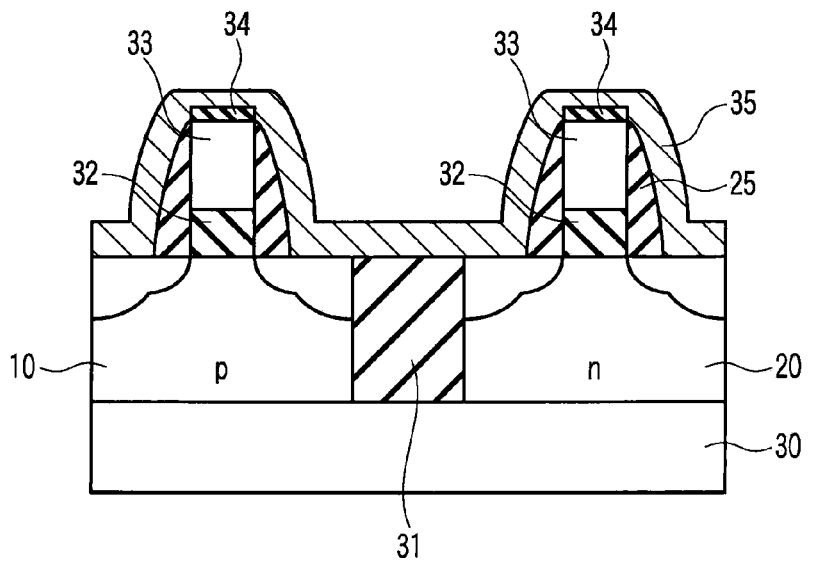

As depicted in FIG. 8G, the upper surface of the gate electrode structure is masked with a resist 34 using a photoengraving process (PEP). Then, an Ni film is deposited to have a thickness of about 10 nm on the entire surface using a known process such as sputtering, for example.

Figure 8H:
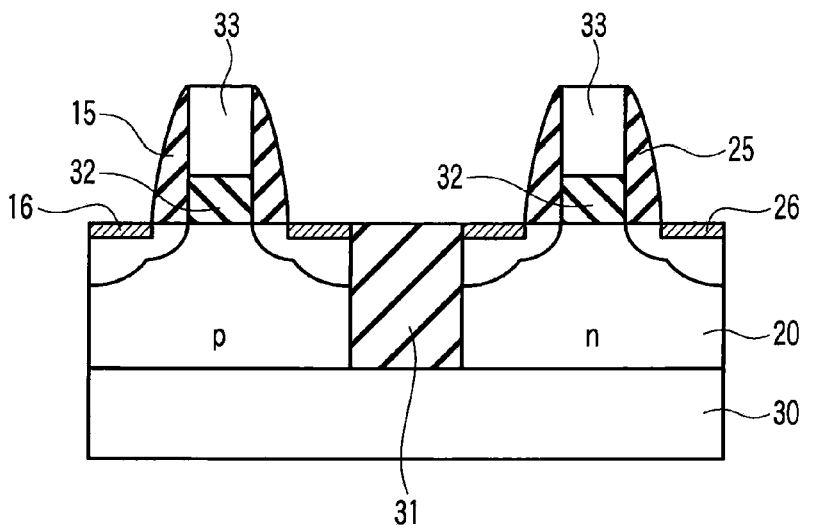

As seen from FIG. 8H, heat treatment at 400° C. is carried out to make a reaction of Ni with Si. Thereafter, non-reaction Ni and the resist on the gate electrode structure are removed, and thereby, NiSi layers 16 and 26 are formed as a contact on the surface of the source/drain region. The surface of the source/drain region may be any other forms so long as it is metal silicide such as CoSi formed in self-align by heat treatment. Heat treatment conditions for forming silicide are properly changeable.

Figure 8I:
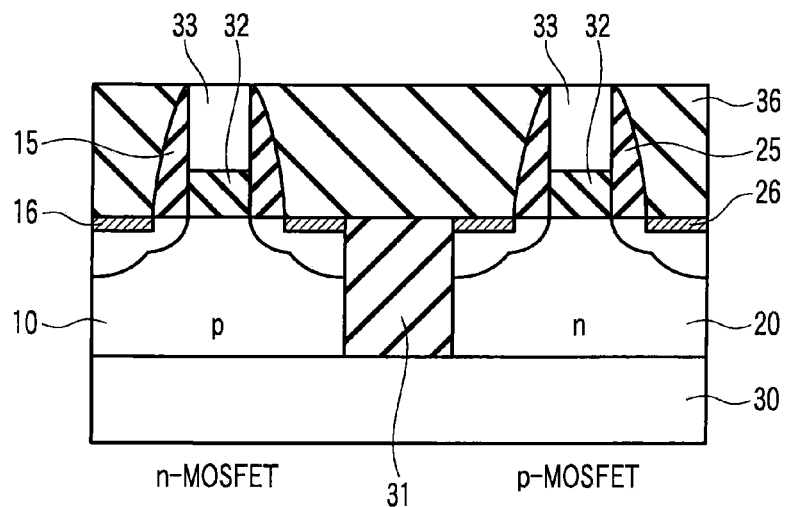

As shown in FIG. 8I, an interlayer insulating film 36 including SiO$_2$ is formed. Thereafter, the entire surface is planarized using CMP to expose the surface of the dummy electrode.

Figure 8J:
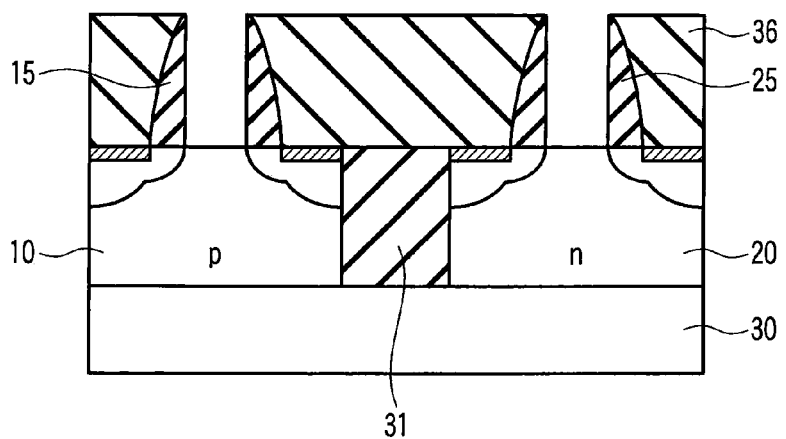

As illustrated in FIG. 8J, the dummy gate electrode 33 is selectively removed via chemical dry etching (CDE) using CF$_4$ etching gas. Then, the dummy gate insulating film 32 is dissolved and removed using hydrofluoric acid to form a gate embedding trench.

Figure 8K:
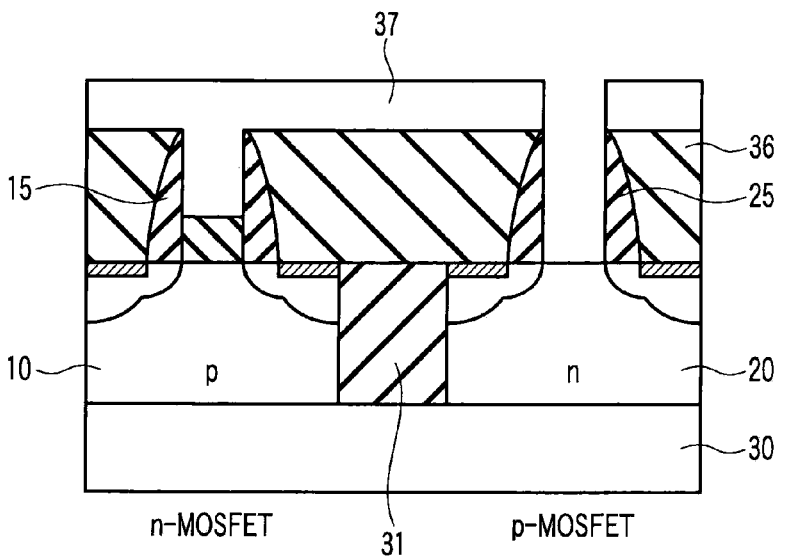

As depicted in FIG. 8K, an Si film having a thickness of 1 μm is formed on the entire surface using a CVD process, for example. Thereafter, the Si film is patterned using PEP so that an Si mask material 37 is formed on regions exclusive of the gate embedding trench of the p-MOS transistor.

Figure 8L:
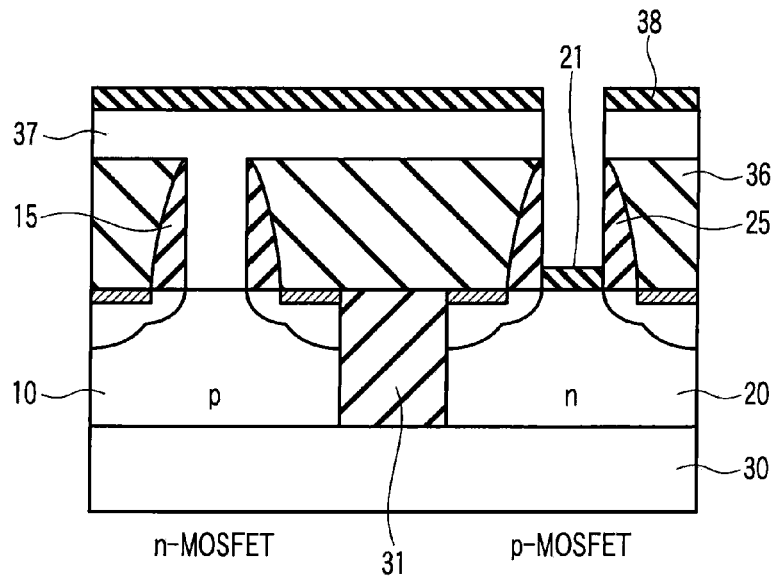

As seen from FIG. 8L, an amorphous LaAlO$_3$ film 38 having an Al/La concentration ratio=1.5 is formed on the mask material 37 and on the gate embedding trench of the p-MOS transistor to have a thickness of about 3 nm using known processes such as CVD process and sputtering. In this case, the amorphous LaAlO$_3$ film 38 formed in the gate embedding trench is a gate insulating film 21 of the p-MOS transistor. The gate insulating film 21 may be another insulating film such as HfO$_2$, Ta$_2$O$_5$, ZrO$_2$, HfSiO, ZrSiO, HfSiON, ZrSiON, HfON, ZrON or HfYO in which Al and La are included, so long as the condition of Al/La concentration ratio=1.5 in the gate insulating film is satisfied. In order to improve the effect of threshold voltage control by fixed charges given by Al, preferably, the Al concentration is high on the Si substrate interface side rather than the electrode side interface.

Figure 8M:
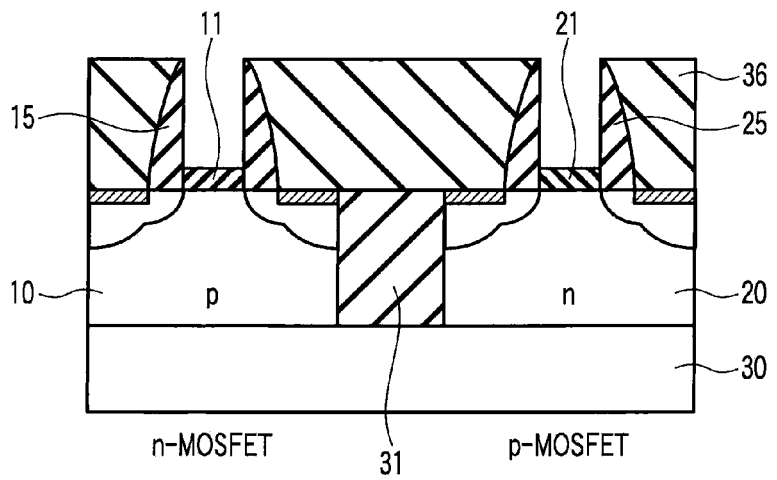

As shown in FIG. 8M, the mask material 37 including Si is removed, and thereafter, an Si mask material (not shown) is formed on regions exclusive of a gat embedded trench of the n-MOS transistor. Then, an amorphous LaAlO$_3$ film having a Al/La concentration ratio=1 is formed as a gate insulating film 11 of the n-MOS transistor to have a thickness of 3 nm, and thereafter, the Si mask material is removed. In addition, an Si oxide may be formed on each semiconductor layer of n- and p-MOS transistors.

Thereafter, TaC is deposited on the LaAlO$_3$ film formed in the gate embedded trench using a known process, and thereby, the structure shown in FIG. 7 is obtained.

According to this embodiment, Al/La concentration ratio=1.5 is set in the gate insulating film 21 of the p-MOS transistor while Al/La concentration ratio=1 is set in the gate insulating film 11 of the n-MOS transistor. In this way, the same gate electrode material (TaC) is used for both n- and p-MOS transistors, and simultaneously, the following effective work functions are obtained. Specifically, the effective work function of the n-MOS transistor is 4.1 eV, which is a TaC inherent value, and the effective work function of the p-MOS transistor is 5.2 eV. Thus, both n- and p-MOS transistors are operable according to proper threshold voltage.

In addition, the Al/La concentration ratio in the gate insulating film is set more than 1 in both n- and p-MOS transistors. This results from the following reasons. Specifically, Al/La concentration ratio=1 is set in the n-MOS transistor so that fixed charges of the gate insulating film 11 becomes the minimum. In this way, it is possible to prevent mobility reduction with scattering by carrier, that is, fixed charges of electrons. On the other hand, in the p-MOS transistor, hole dull to scattering by fixed charges as compared with electrons. Thus, in the p-MOS transistor, the composition, that is, Al/La concentration ratio is shifted from 1 to generate fixed charges. Thus, the threshold voltage is preferably controlled.

Second Embodiment

FIGS. 9A to 9E are cross-sectional views showing a process of manufacturing a CMOS transistor according to a second embodiment of the present invention.

The second embodiment relates to a process of manufacturing a CMOS transistor forming a gate insulating film before a source/drain region is formed. The final structure of the CMOS transistor is the same as the first embodiment.

Figure 9A:
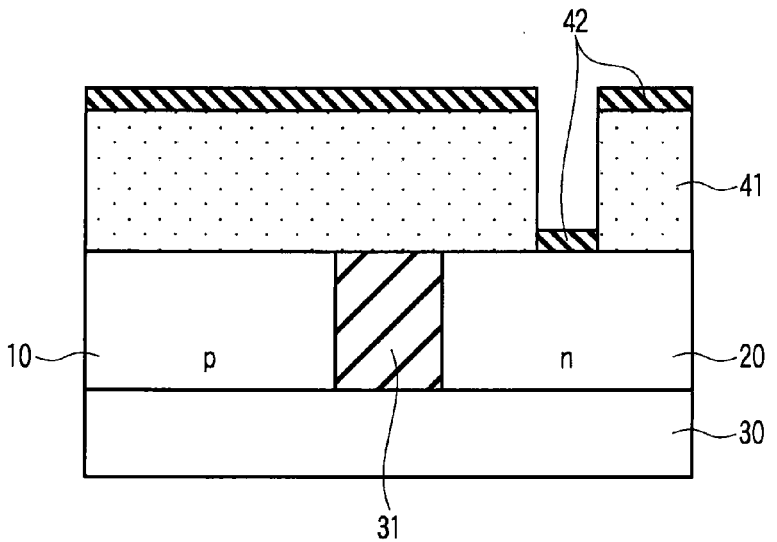
FIGS. 9A to 9E are cross-sectional views stepwise showing a process of manufacturing a CMOS transistor according to a second embodiment.

In the same manner as the first embodiment, a device isolation region 31 including a silicon oxide layer is formed on the boundary surface between p-type and n-type Si regions 10 and 20. Thereafter, as shown in FIG. 9A, a resist mask material 41 is formed on regions exclusive of a surface formed with a gate insulating film of the p-MOS transistor. Then, an amorphous LaAlO$_3$ film 42 having Al/La concentration ratio=1.5 is formed as a gate insulating film 21 of the p-MOS transistor to have a thickness of about 3 nm using known process such as CVD and sputtering. Thereafter, the resist mask material 41 is removed.

Figure 9B:
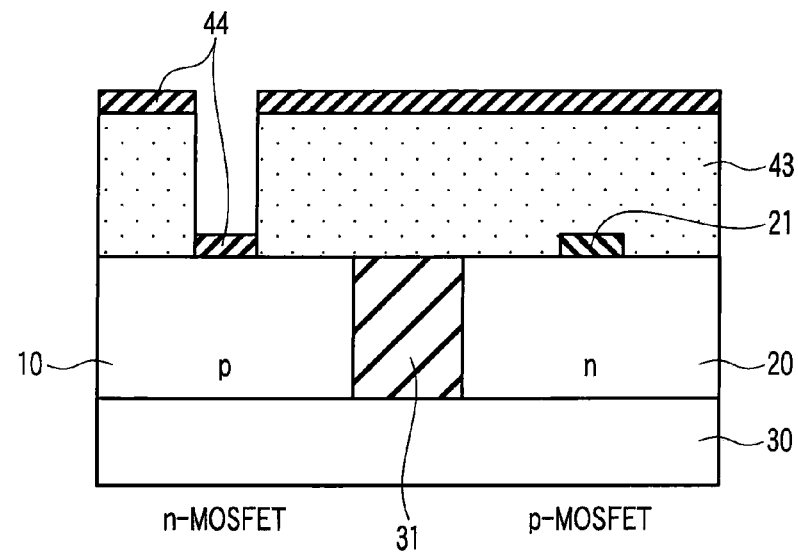

As illustrated in FIG. 9B, a resist mask material 43 is formed on regions exclusive of a surface formed with a gate insulating film of the n-MOS transistor, like the process of FIG. 9A. Then, an amorphous LaAlO$_3$ film 44 having Al/La concentration ratio=1 is formed as a gate insulating film 11 of the n-MOS transistor to have a thickness of about 3 nm using known process such as CVD and sputtering. Thereafter, the resist mask material 43 is removed.

Figure 9C:
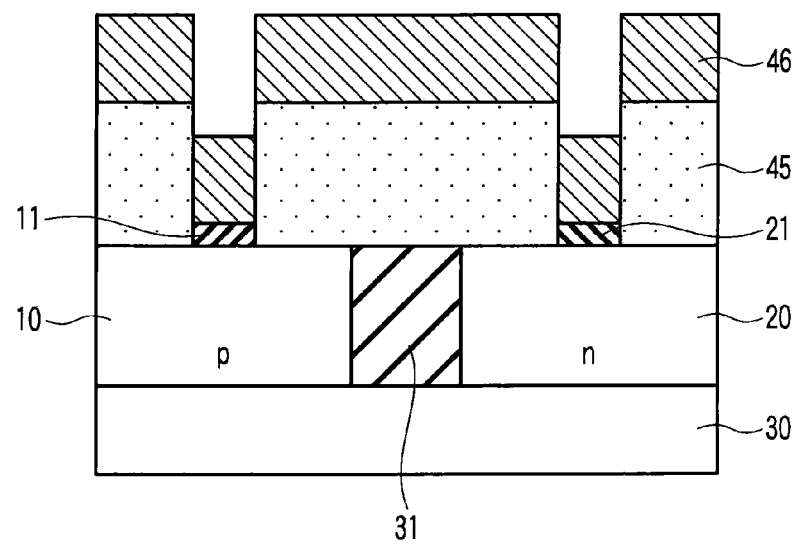

As depicted in FIG. 9C, a resist mask material 45 is formed on regions exclusive of each gate insulating film surface of n- and p-MOS transistors. Then, a TaC film 46 is deposited as a gate electrode material using a known process so that the TaC film 46 is formed on the mask material 45, gate insulating films 11 and 21.

Figure 9D:
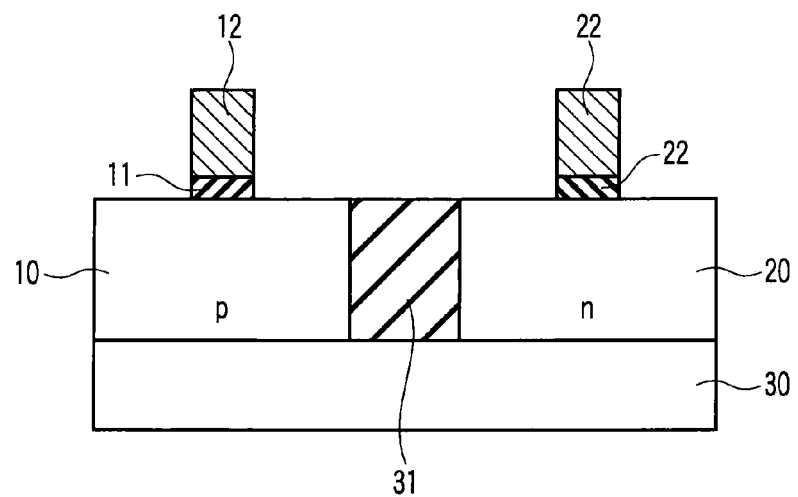

As seen from FIG. 9D, the resist mask material 45 is removed using lift-off. In this way, the TaC film 46 except the gate portion is removed to form gate electrodes 12 and 22.

Figure 9E:
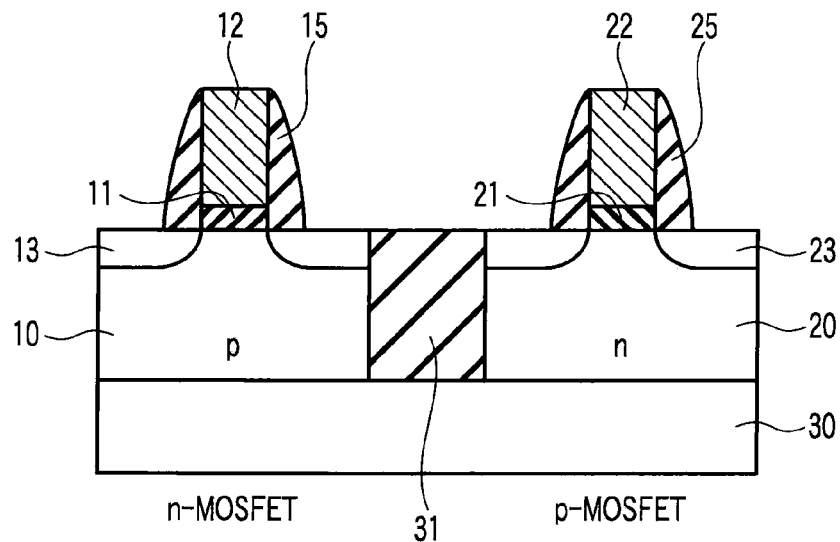

As shown in FIG. 9E, n-type and p-type impurity ions are implanted onto each of n- and p-MOS transistors to form a diffusion layer functioning as source/drain extension layers 13 and 23. Thereafter, an SiN layer is deposited on the entire surface using a known process, and then, gate sidewall insulating films 15 and 25 are formed using RIE.

Thereafter, n-type and p-type impurity ions are implanted onto each of n- and p-MOS transistors using gate electrodes 12, 22 and gate sidewalls 15, 25 as a mask. Heat treatment for activation is carried out to form source/drain regions 14 and 24 including shallow extension layers 13 and 23. In this way, the CMOS transistor shown in FIG. 7 is obtained.

According to the second embodiment, it is possible to obtain a CMOS transistor having Al/La concentration ratio=1.5 in the gate insulating film 21 of the p-MOS transistor and having Al/La concentration ratio=1 in the gate insulating film 11 of the n-MOS transistor. Therefore, the same effect as the forgoing first embodiment is obtained. In addition, there is no need of forming a dummy gate; therefore, this serves to simplify the process.

Third Embodiment

Figure 10A:
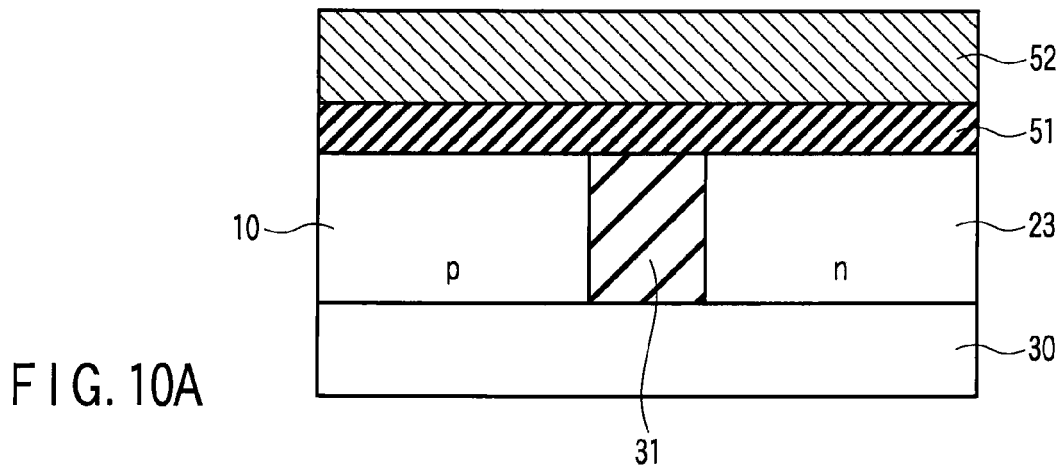
FIGS. 10A to 10C are cross-sectional views stepwise showing a process of manufacturing a CMOS transistor according to a third embodiment.
Figure 10B:
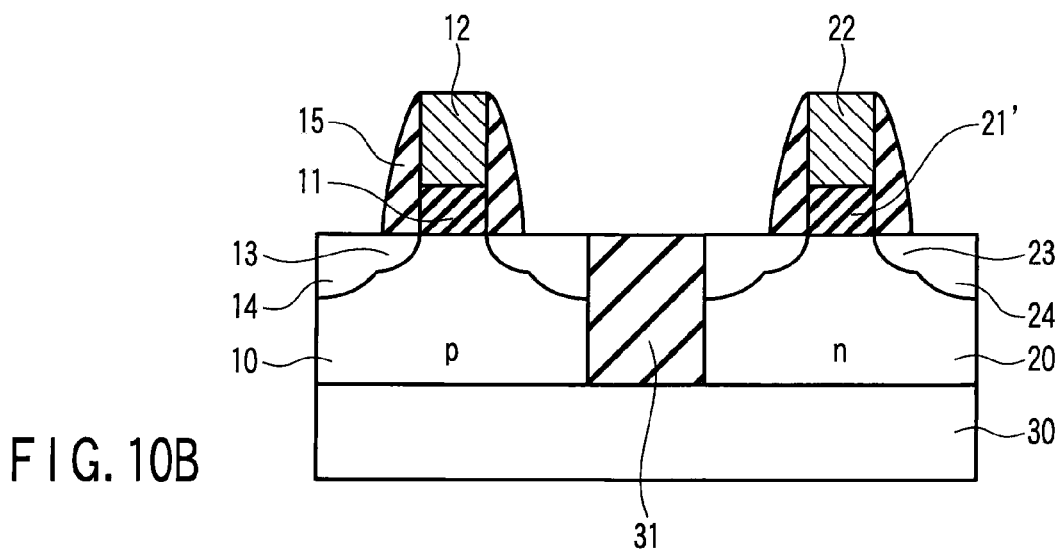
Figure 10C:
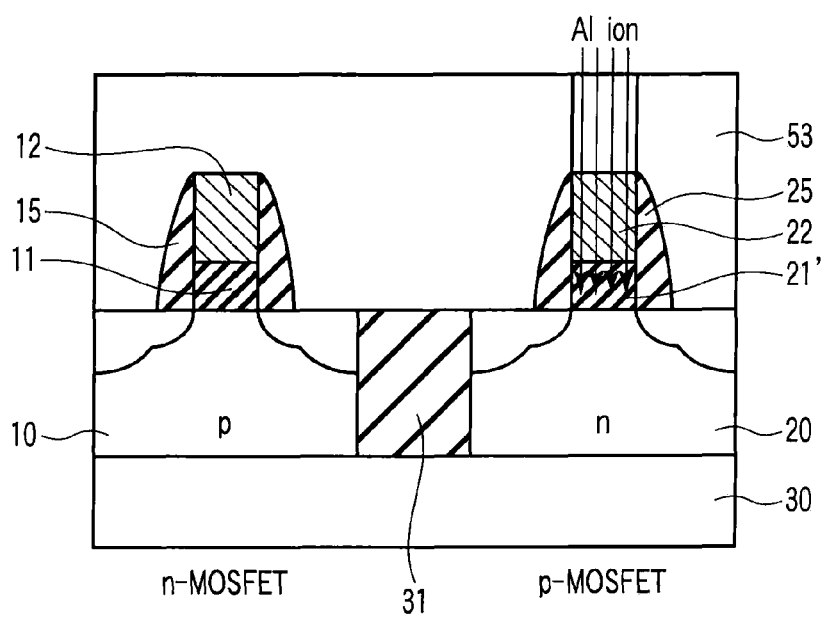

FIGS. 10A to 10C are cross-sectional views showing a process of manufacturing a CMOS transistor according to a third embodiment of the present invention.

The third embodiment relates to a method of manufacturing a CMOS transistor, which sets an Al/La concentration ratio of a gate insulating film of a p-MOS transistor higher than that of gate insulating film of an n-MOS transistor by Al ion implantation. The structure of the CMOS transistor is the same as the first embodiment.

As shown in FIG. 10A, a device isolation layer 31 including a silicon oxide is formed at the boundary surface between p-type and n-type Si regions 10 and 20, like the foregoing first embodiment. Then, an amorphous LaAlO$_3$ film 51 having an Al/La concentration ratio=1 is deposited as a gate insulating film on the device isolation layer 31 formed between p-type and n-type Si regions 10 and 20 to have a thickness of about 3 nm. A TaC film 52 is further deposited as a gate electrode on the film 51.

As illustrated in FIG. 10B, the foregoing LaAlO$_3$ film 51 and TaC film 52 are etched using known etching method such as RIE to form a gate electrode structure. Specifically, the n-MOS transistor region is formed with a gate insulating film 11 and a gate electrode 12. On the other hand, the p-MOS transistor region is formed with a gate insulating film 21' and a gate electrode 22. Thereafter, gate sidewall insulating films 15, 25, extension layers 13, 23, and source/drain regions 14, 24 are formed in the same manner as the manufacturing process of the first embodiment.

In this case, the gate electrodes 12 and 22 are formed by etching the TaC film 52; therefore, these electrodes are formed of the same material; however, the foregoing formation is not limited to this. For example, different metal materials are formed on p-type and n-type Si regions 10 and 20, and thereby, gate electrodes 12 and 2 may be formed of different materials.

As depicted in FIG. 10C, regions excepting the gate electrode surface of the p-MOS transistor is masked with a resist mask material 53 using PEP. Then, according to acceleration voltage set such that ions are implanted onto the gate insulating region, Al ions are implanted onto the entire surface so that the Al/La concentration ratio of the gate insulating film 21' of the p-MOS transistor increases to 1.5. Thereafter, annealing may be carried out in an oxygen atmosphere, for example.

Thereafter, the resist is removed, and thereby, the same CMOS transistor as shown in FIG. 7 is obtained.

As described above, the amorphous LaAlO3 film 51 having the concentration ratio=1 is formed on the foregoing p-type and n-type Si regions 10 and 20 to have a thickness of about 3 nm. Thereafter, Al ions are implanted, and thereby, the Al/La ratios of the gate insulating films are set to 1 and 1.5, respectively. Conversely, La ions are selectively implanted, and thereby, the same final structure is obtained. Specifically, an amorphous LaAlO$_3$ film 51 having an Al/La concentration ratio=1.5 is formed on p-type and n-type Si regions 10 and 20. Thereafter, La ions are implanted onto the gate insulating film 11 only of the n-MOS transistor. In this way, the same structure is realized. However, La is heavy (atomic weight is large); for this reason, there is a problem that ion implantation is difficult. Therefore, preferably, Al ions are implanted.

According to the third embodiment, gate insulating films 11, 21' and gate electrodes 12, 22 are formed, and thereafter, the source/drain regions 14 and 24 are formed. Like the foregoing first embodiment, the source/drain regions 14 and 24 may be formed before these gate insulating films 11, 21' and gate electrodes 12, 22 are formed. Al or La ion implantation to the gate insulating film may be carried out before the source/drain regions 14 and 24 are formed.

Fourth Embodiment

Figure 11A:
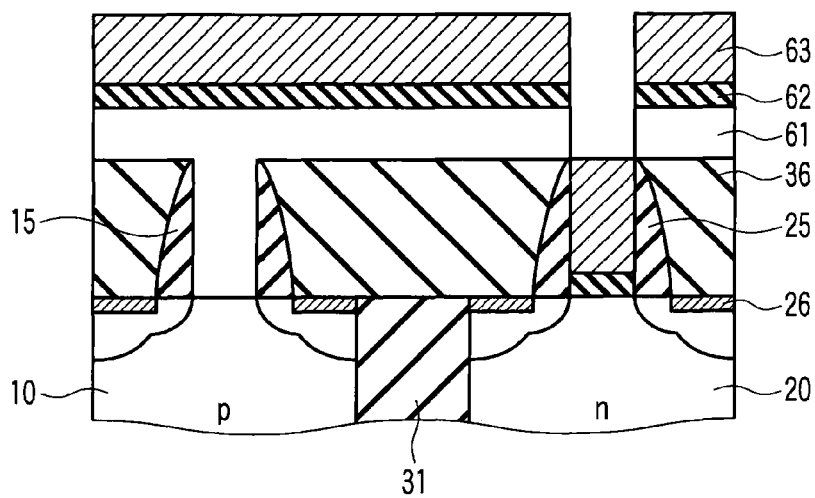
Figure 11B:
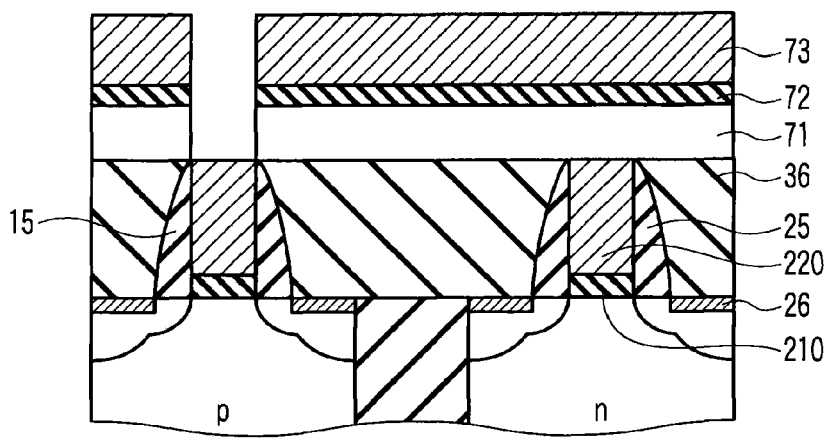

FIGS. 11A to 11C are cross-sectional views showing a process of manufacturing a CMOS transistor according to a fourth embodiment of the present invention.

The fourth embodiment relates to an example of using different gate electrode material in n- and p-MOS transistors. Specifically, the CMOS transistor of the fourth embodiment has the same structure as that of the first embodiment except the following points. Namely, the gate electrode of the p-MOS transistor of the first embodiment is formed of W. The Al/La ratio of the LaAlO$_3$ film functioning as the gate insulating film of the p-MOS transistor is 1.1. According to the fourth embodiment, the process of manufacturing the COMS transistor is the same as the first embodiment up to the dummy gate removing process shown in FIG. 8J.

The dummy gate is removed, and thereafter, according to the manufacturing process of this embodiment, as shown in FIG. 11A, an Si mask material 61 is formed on regions except a gate embedded trench of the p-MOS transistor. An amorphous LaAlO$_3$ film 62 having an Al/La concentration ratio=1.1 is formed on the mask material 61 and the gate embedding trench of the p-MOS transistor using known process such as CVD and sputtering to have a thickness of about 3 nm. Thereafter, a W film 63 having a Fermi level near to valence band from the middle of silicon energy gap is deposited as a gate electrode of the p-MOS transistor.

The Si mask material 61 is removed, and thereby, a gate insulating film 210 and a gate electrode 220 of the p-MOS transistor are formed. As illustrated in FIG. 11B, an Si mask material 71 is formed on regions except a gate embedded trench of the n-MOS transistor, like the process of FIG. 11A. Then, an amorphous LaAlO$_3$ film 72 having an Al/La concentration ratio=1 is formed as a gate insulating film of the n-MOS transistor on the mask material 71 and in the gate embedded trench of the n-MOS transistor to have a thickness of about 3 nm. Thereafter, a TaC film 73 having a Fermi level near to a conduction band away from the middle of silicon energy gap is deposited.

As depicted in FIG. 11C, the Si mask material 71 is removed, thereby, a gate insulating film 110 and a gate electrode 120 of the n-MOS transistor are formed. Namely, the Si mask material 71 is removed, thereby, the gate insulating film 110 and the gate electrode 120 are formed on the n-MOS transistor region. In this way, the following CMOS transistor is obtained. Specifically, the CMOS transistor has an N-MOS transistor including the gate insulating film 110 including the amorphous LaAlO$_3$ film 72 having an Al/La concentration ratio=1 and the gate electrode 120 including the TaC film 73. The CMOS transistor further has a p-MOS transistor having the gate insulating film 210 including the amorphous LaAlO$_3$ film 62 having an Al/La concentration ratio=1.1 and the gate electrode 220 including the W film 63.

According to the fourth embodiment, W and TaC are used as the gate electrodes of p- and N-MOS transistors. In this case, the gate electrode material is not limited to the foregoing materials. The gate electrode of the p-MOS transistor has a Fermi level between the middle of energy gap of the semiconductor and the valence band edge of the semiconductor. For example, materials containing Re, Ru, Rh, Pd, Ir, Au, Mo and Ni may be used. On the other hand, the gate electrode of the n-MOS transistor has A Fermi level between the middle of energy gap of the semiconductor and the conduction band edge of the semiconductor. For example, materials containing Ti, Ag, Ta, Sb, Cr, Cu, Nb and In may be used.

According to this embodiment, the n-MOS transistor has the effective work function showing TaC inherent value, that is, 4.1 eV, like the first embodiment. On the other hand, the p-MOS transistor shows 5.2 eV larger than W inherent value, that is, 4.6 eV because the Al/La concentration ratio of the gate insulating film is set to 1.1. Therefore, both n- and p-MOS transistors are operable according to the proper threshold voltage, like the first embodiment.

Fifth Embodiment

FIG. 12 is a perspective view schematically showing the structure of a CMOS transistor according to a fifth embodiment of the present invention.

The fifth embodiment is an embodiment applied to a so-called FinFET projecting p- and n-type semiconductor regions from a substrate surface.

An Si substrate (semiconductor substrate) 80 is formed with an embedded insulating film 81 such as SiO$_2$. A fin-shaped p-type Si layer (first semiconductor region) 82 and a fin-shaped n-type Si layer (second semiconductor region) 83 are formed in parallel on the insulating film 81. A part of the upper surface and the side of the p-type Si layer 82 is formed with a gate insulating film 84 including an amorphous LaAlO$_3$ having a concentration ratio of Al/La=1. A part of the upper surface and the side of the n-type Si layer 83 is formed with a gate insulating film 85 including an amorphous LaAlO$_3$ having a concentration ratio of Al/La=1.5. A common gate electrode 86 including TaC is formed to cover the gate insulating films 84 and 85. The side of the gate electrode is formed with a gate sidewall insulating film 87.

In FIG. 12, the gate electrode is formed in common to both p- and n-MOS transistors; in this case, individual gate electrodes may be used. In FIG. 12, one transistor has one fin-shaped Si layer, for convenience; in this case, one transistor may have a plurality of fin-shape Si layers.

Even if the foregoing structure is given, each Al/La concentration ratio of the gate insulating films 84 and 85 is changed between p- and n-MOS transistors. In this way, the same gate electrode material is used, and simultaneously, both n- and p-MOS transistors are operable according to the proper threshold voltage. Thus, the same effect as the first embodiment is obtained.

(Modification)

The present invention is not limited to the foregoing embodiments. For example, the gate electrode material of n- and p-MOS transistors is not limited to TaC or W; in this case, changes may be properly made in accordance with specifications. The material forming the gate electrode of the n-MOS transistor has A Fermi level between the middle of energy gap of a semiconductor and conduction band edge of the semiconductor. The material forming the gate electrode of the p-MOS transistor has a Fermi level between the middle of energy gap of a semiconductor and the valence band edge of the semiconductor. The Al/La concentration ratio of the gate insulating film is not always limited to the value described in the embodiments. In this case, changes may be properly made in accordance with the used gate electrode material.

According to the foregoing embodiments, an oxide film is used as the gate insulating film. In this case, a nitride film may be used without being limited to the oxide film. In other words, the present invention is applicable to a MIS transistor in addition to the MOS transistor.

As described above, according to the embodiments of the present invention, the gate insulating film is formed using an insulating film containing La and Al. An atomic density ratio Al/La of Al to La is changed between p- and n-MIS transistors. In this way, proper threshold voltage is obtained in both n- and p-MIS transistors using a metal gate electrode and a high-dielectric-constant (high-k) gate insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A complementary semiconductor device comprising:
    a substrate;
    a first semiconductor region formed on a surface of the substrate;
    a second semiconductor region formed on the surface of the substrate apart from the first semiconductor region;
    an n-MIS transistor having a first gate insulating film including La and Al, formed on the first semiconductor region, and a first gate electrode formed on the first gate insulating film; and
    a p-MIS transistor having a second gate insulating film including La and Al, formed on the second semiconductor region, and a second gate electrode formed on the gate insulating film,
    an atomic density ratio Al/La in the second gate insulating film being larger than an atomic density ratio Al/La in the first gate insulating film.

2. The device according to claim 1, wherein the atomic density ratio Al/La in the first gate insulating film and the second gate insulating film are both more than 1.

3. The device according to claim 1, wherein
    first lattice tensile strain is applied in a direction parallel to the surface of the substrate, within a depth of 10 nm from an interface with the first gate insulating film,
    second lattice tensile strain is applied in a direction parallel to the surface of the substrate, within a depth of 10 nm from an interface with the second gate insulating film, and
    the first lattice tensile strain is larger than the second lattice tensile strain.

4. The device according to claim 1, wherein the first gate electrode and the second gate electrode are formed of the same material.

5. The device according to claim 1, wherein in the second gate insulating film, an Al concentration in the interface with the substrate is higher than that in the interface with the second gate electrode.

6. The device according to claim 1, wherein in the first gate insulating film, an La concentration in the interface with the substrate is higher than an La concentration in the interface with the first gate electrode.

7. The device according to claim 1, wherein
    a first material forming the first gate electrode has a Fermi level between the middle of energy gap of a first semiconductor forming the first semiconductor region and a conduction band edge of the first semiconductor, and
    a second material forming the second gate electrode has a Fermi level between the middle of energy gap of a second semiconductor forming the second semiconductor region and a valence band edge of the second semiconductor.

8. The device according to claim 1, wherein at least one of the first gate electrode side of the first gate insulating film and the second gate electrode side of the second gate insulating film has an insulating layer including one selected from the group consisting of $HfO_2$, HfSiO, HfSiON, HfAlO and HfLaO.

* * * * *